United States Patent
Künne et al.

(10) Patent No.: US 11,983,126 B2
(45) Date of Patent: May 14, 2024

(54) COMPONENT FOR READING OUT THE STATES OF QUBITS IN QUANTUM DOTS

(71) Applicants: Rheinisch-Westfälische Technische Hochschule (RWTH) Aachen, Aachen (DE); Forschungszentrum Jülich GmbH, Jülich (DE)

(72) Inventors: Matthias Künne, Aachen (DE); Hendrik Bluhm, Aachen (DE); Lars Schreiber, Aachen (DE)

(73) Assignees: Rheinisch-Westfälische Technische Hochschule (RWTH) Aachen, Aachen (DE); Forschungszentrum Jülich GmbH, Jülich (DE)

( * ) Notice: Subject to any disclaimer, the term of this patent is extended or adjusted under 35 U.S.C. 154(b) by 155 days.

(21) Appl. No.: 17/642,677

(22) PCT Filed: Sep. 21, 2020

(86) PCT No.: PCT/DE2020/100809
§ 371 (c)(1),
(2) Date: Mar. 12, 2022

(87) PCT Pub. No.: WO2021/052536
PCT Pub. Date: Mar. 25, 2021

(65) Prior Publication Data
US 2022/0327072 A1 Oct. 13, 2022

(30) Foreign Application Priority Data

Sep. 20, 2019 (DE) .................... 10 2019 125 351.9
Jun. 10, 2020 (DE) .................... 10 2020 115 493.3

(51) Int. Cl.
*G06F 13/20* (2006.01)
*G06N 10/40* (2022.01)
(Continued)

(52) U.S. Cl.
CPC ............ *G06F 13/20* (2013.01); *G06N 10/40* (2022.01); *H01L 29/423* (2013.01);
(Continued)

(58) Field of Classification Search
CPC ..... G06F 13/20; G06F 2213/40; G06N 10/40; G06N 10/00; H01L 29/423;
(Continued)

(56) References Cited

U.S. PATENT DOCUMENTS 8,164,082 B2     4/2012   Friesen
11,171,225 B2 *  11/2021  Voinigescu ....... H01L 29/66984
(Continued)

FOREIGN PATENT DOCUMENTS

AU     2007200501 A1    8/2008
DE     102019202661 A1  8/2020
(Continued)

OTHER PUBLICATIONS

G.J. Schinner et al., "Confinement and Interaction of Single Indirect Excitons in a Voltage-Controlled Trap Formed Inside Double InGaAs Quantum Wells", New Journal of Physics, vol. 110, issue. 12, pp. 127403-127408, Mar. 19, 2013.
(Continued)

*Primary Examiner* — Arnold M Kinkead

(57) ABSTRACT

An electronic component is formed by a semiconductor component or a semiconductor-like structure having gate electrode assemblies, for reading out the quantum state of a qubit in a quantum dot. The electronic component comprises a substrate having a two-dimensional electron gas or electron hole gas. Electrical contacts connect the gate electrode assemblies to voltage sources. The gate electrode assemblies have gate electrodes, which are arranged on a surface of the electronic component, for producing potential wells in the substrate.

13 Claims, 4 Drawing Sheets

(51) Int. Cl.
  *H01L 29/423* (2006.01)
  *H01L 29/66* (2006.01)
  *H03K 17/92* (2006.01)
  *H10N 60/10* (2023.01)
  *H10N 69/00* (2023.01)

(52) U.S. Cl.
  CPC .. *H01L 29/42316* (2013.01); *H01L 29/66977* (2013.01); *H03K 17/92* (2013.01); *H10N 60/11* (2023.02); *H10N 60/128* (2023.02); *H10N 69/00* (2023.02); *G06F 2213/40* (2013.01)

(58) Field of Classification Search
  CPC ......... H01L 29/42316; H01L 29/66977; H01L 29/762; H01L 29/401; H01L 29/7613; H01L 29/778; H01L 29/205; H03K 17/92; H10N 60/11; H10N 60/128; H10N 69/00; B82Y 10/00
  USPC ............. 326/6; 505/842, 832; 365/162, 161, 365/160; 977/932
  See application file for complete search history.

(56) References Cited

U.S. PATENT DOCUMENTS

| | | | |
|---|---|---|---|
| 2008/0185576 A1 | 8/2008 | Hollenberg et al. | |
| 2015/0279981 A1 | 10/2015 | Eriksson et al. | |
| 2016/0125310 A1 | 5/2016 | Hollenberg et al. | |
| 2016/0275410 A1 | 9/2016 | Rogge et al. | |
| 2017/0317203 A1 | 11/2017 | Petta et al. | |
| 2018/0226451 A1 | 8/2018 | Dzurak et al. | |
| 2020/0176569 A1 | 6/2020 | Singh et al. | |
| 2020/0312990 A1 | 10/2020 | Roberts et al. | |
| 2021/0279134 A1 | 9/2021 | Versluis et al. | |
| 2023/0197833 A1* | 6/2023 | Thomas ............ | H01L 29/66977 327/527 |

FOREIGN PATENT DOCUMENTS

| | | |
|---|---|---|
| EP | 2075745 A1 | 7/2009 |
| EP | 2560133 A1 | 2/2013 |
| EP | 3016035 B1 | 1/2019 |
| EP | 4075153 A1 * | 10/2022 |
| JP | S5994458 U | 6/1984 |
| WO | 2014146162 A1 | 9/2014 |
| WO | 2017020095 A1 | 2/2017 |
| WO | 2017213651 A1 | 12/2017 |
| WO | 2018062991 A1 | 4/2018 |
| WO | 2018236403 A1 | 12/2018 |

OTHER PUBLICATIONS

High, A. A., et al. "Trapping indirect excitons in a GaAs quantum-well structure with a diamond-shaped electrostatic trap." Physical review letters 103.8 (2009): 087403.

Horsman, Clare, et al. "Surface code quantum computing by lattice surgery." New Journal of Physics 14.12 (2012): 123011.

Künne et al., co-pending U.S. Appl. No. 17/642,484, national phase entry of PCT/DE2020/100812.

Künne et al., co-pending U.S. Appl. No. 17/642,527; national phase entry of PCT/DE2020/100811.

Künne et al., co-pending U.S. Appl. No. 17/761,832, national phase entry of PCT/DE2020/100814.

Künne et al., co-pending U.S. Appl. No. 17/636,522; national phase entry of PCT/DE2020/100766.

Künne et al., co-pending U.S. Appl. No. 17/761,885; national phase entry of PCT/DE2020/100810.

Schinner, G. J., et al. "Electrostatically trapping indirect excitons in coupled In×Ga 1−×As quantum wells." Physical Review B 83.16 (2011): 165308.

Veit Langrock, Numerical and theoretical investigation of long-range coherent electron shuttling devices in Silicon/Silicon-Germanium quantum wells for scalable quantum computing, Nov. 30, 2017, retrieved online from https://www.quantuminfo.physik.rwth-aachen.de/global/show_document.asp?id=aaaaaaaaabbnooi.

* cited by examiner

COMPONENT FOR READING OUT THE STATES OF QUBITS IN QUANTUM DOTS

TECHNICAL FIELD

The disclosure relates to an electronic component, which is formed by a semiconductor component or a semiconductor-like structure having gate electrode assemblies, for reading out the quantum state of a qubit in a quantum dot. The disclosure further relates to a method for such an electronic component.

BACKGROUND

Conventional computers use semiconductor components with integrated circuits. These circuits always work with systems which are based on a logical "0" or "1"—i.e. the switch is "on" or "off". In semiconductor memories, this is realized in that the potential is either above or below a threshold value. These two states form the smallest unit in computers and are referred to as "bits".

These semiconductor components often consist of doped silicon elements in order to realize the circuits. For example, transistor circuits can be arranged in such semiconductor components and linked to form a logic circuit. Through continuously improving chemical and physical manufacturing processes, these semiconductor components can now be produced with increasingly extreme compactness. However, this compactness has reached its physical limits. The density of the circuits as well as the temperature often leads to problems in such semiconductor components. In this manner optimizations in particular can be achieved through several layer models, higher switching speeds, or the selection of the semiconductor material. Nevertheless, the computing power is often insufficient for many applications, e.g. in cryptographic technology or when calculating weather or climate models, due to the enormous amounts of data.

To significantly increase computing power, models for so-called quantum computers have long been known. For a variety of reasons, though, it has not yet been technically possible to implement them. The models of quantum computers are designed to exploit the quantum mechanical states of particles such as electrons. A quantum mechanical system with two states as the smallest unit for storing information is referred to as a "qubit". A qubit is defined, for example, by its quantum mechanical spin state, which can be "up" or "down".

The principle of electron spin qubits is always the same, regardless of the material system selected. A semiconductor heterostructure serves as the substrate in this case. The semiconductor heterostructure comprises a two-dimensional electron gas (2DEG). Semiconductor heterostructures are monocrystalline layers of semiconductors with different compositions grown on top of each other. These layer structures provide numerous technically relevant quantization effects in terms of their electronic and optical properties. For this reason, they are particularly suitable for use in the production of microelectronic components. The most important combination of materials at the present time for the production of semiconductor heterostructures is the GaAs/AlGaAs system.

Semiconductor heterostructures form so-called quantum films at the interfaces between different materials. These arise in particular because of the different energy levels in the two materials. The defined energy distribution resulting therefrom causes charge carriers from the surrounding area to collect in the quantum film. Their freedom of movement is largely restricted to the layer in the film, and they form the two-dimensional electron gas (2DEG).

A nanoscopic material structure is referred to as a quantum dot. Semiconductor materials are particularly suitable for this. The mobility of the charge carriers, both electrons and holes, is so restricted in a quantum dot that their energy can no longer assume continuous values, and can thus only assume discrete values. Using nanoscale gate electrodes (also referred to as gates), which are applied to the surface of the component, the potential landscape within the two-dimensional electron gas (2DEG) is shaped in such a manner that individual electrons can be captured in the quantum dots. Electronic states can be split with regard to their spin state by means of an external magnetic field (Zeeman effect) and thus addressed separately. The spins of these electrons then serve as the basis of eigenstates for the purpose of forming a logical qubit. Furthermore, superimposed states of these two eigenstates can also be realized due to quantum mechanical effects.

US 2017/0317203 A1 discloses a quantum dot device comprising at least three conductive layers and at least two insulating layers. The three conductive layers are electrically insulated from one another. It is described there that one conductive layer is composed of a different material than the other two conductive layers. The conductive layers can include or be composed entirely of aluminum, gold, copper, or polysilicon, for example. The insulating layers, on the other hand, are composed of silicon oxide, silicon nitride, and/or aluminum oxide, for example. The connections between the conductive layers and the insulating layers can cause, inter alia, individual electrons to be shuttled through quantum dots of the device using voltage pulses.

In this quantum dot device, an electron is confined in a potential well. Through quantum mechanical tunneling, an electron is moved from quantum dot to quantum dot. This can lead to inaccuracies or falsifications of the information regarding the quantum mechanical state when an electron moves over longer distances.

WO 2017/020095 A1 discloses a scalable architecture for a processing device for performing quantum processing. The architecture is based on full-silicon CMOS fabrication technology. Transistor-based control circuits are used together with floating gates to operate a two-dimensional array of qubits. The qubits are defined by the spin states of a single electron, which is trapped in a quantum dot. A higher level is described here, meaning how individual qubits can be electrically driven, for example via transistors, etc., including qubit operation and readout. Although reference is made to a "scalable architecture", the array shown does not allow any real scaling, meaning inter alia integration of cryogenic electronics, since no space can be created between the qubits.

U.S. Pat. No. 8,164,082 B2 describes a spin bus quantum computer architecture comprising a spin bus comprising of a plurality of strongly coupled and always on qubits defining a string of spin qubits. A plurality of information-bearing qubits are arranged adjacent to a qubit of the spin bus. Electrodes are formed to the information-bearing qubits and the spin bus qubits to allow control of the establishment and breaking of coupling between qubits in order to allow control of the establishment and breaking of coupling between each information-bearing qubit and the spin bus qubit adjacent to it. The spin bus architecture allows rapid and reliable long-range coupling of qubits.

EP 3 016 035 B1 describes a processing apparatus and methods to operate the same, and particularly, but not exclusively, the invention relates to a quantum processing apparatus which is controllable to perform adiabatic quantum computations.

A quantum processor has the following features: a plurality of qubit elements and a control structure comprising a plurality of control members, wherein each control member is arranged to control a plurality of qubit elements. The control structure is controllable to perform quantum computation using the qubit elements, wherein a quantum state of the qubit elements is encoded in the nuclear or electron spin of one or more donor atoms. The donor atoms are arranged in a plane embedded in a semiconducting structure. A first set of donor atoms is arranged to encode quantum information related to the quantum computation. A second set of donor atoms is arranged to facilitate electromagnetic coupling between one or more of the first set of donor atoms. The donor atoms of the first set are arranged in a two-dimensional matrix arrangement. The plurality of control members comprises a first set of elongated control members arranged in a first plane above the plane comprising the donor atoms. A second set of elongated control members are provided which are arranged in a second plane below the plane comprising the donor atoms.

To implement a universal quantum computer, it must be possible to couple the qubits over distances of at least a few micrometers, in particular to create space for local control electronics. Structures and structural elements must be provided which allow a quantum dot to be transported to different targets in order to be able to construct logic circuits. There are already approaches in the state of the art in which one or two-dimensional arrays were built from separate quantum dots, through which electrons can then be transported. Due to the very large number of gate electrodes required and corresponding voltages to be set, coupling over several micrometers is impossible to implement or can only be implemented with significant effort using this approach.

While operations on individual qubits can already be checked and evaluated to a satisfactory extent, the ability to couple qubits is probably the main problem yet to be solved in order to realize complex logic circuits and implement a universal quantum computer.

SUMMARY

An object of the disclosure is to eliminate the disadvantages of the prior art and to provide an electronic component which allows logic circuits to be realized with quantum dots, whereby the quantum mechanical state is intended to be determined.

The object is achieved in an electronic component for reading out the quantum state of a quantum dot, which comprises
  a) a substrate with a two-dimensional electron gas or electron hole gas;
  b) electrical contacts for connecting the gate electrode assemblies to voltage sources;
  c) a gate electrode assembly having gate electrodes, which is arranged on a surface of the electronic component, for producing a potential well in the substrate;
  d) the gate electrodes of the gate electrode assemblies have parallel electrode fingers, whereby
    i) in a first gate electrode assembly, the electrode fingers are interconnected in a periodically alternating manner, which causes an almost continuous movement of the potential well through the substrate, whereby a first quantum dot is transported together with this potential well; and
    ii) the electrode fingers of a second gate electrode assembly form a static potential well in which a charge carrier with a known quantum mechanical state is provided.
  e) a sensor element is provided for detecting changes in the charge, which detects the charge in the static potential well, wherein the first quantum dot is transported to the second quantum dot.

The object is further achieved by a method for such an electronic component having the following method steps:
  a) introduction of a first quantum dot into the static potential well;
  b) initialization of the charge of the first quantum dot;
  c) detection of the charge of the first quantum dot by means of the sensor element;
  d) introduction of a qubit of the second quantum dot into the movable potential well;
  e) bring the movable potential well towards the static potential well;
  f) detection of the charge by means of the sensor element in the static potential well;
  g) check the change in charge in the static potential well.

The disclosure is based in principle on the physical Pauli Exclusion Principle, which states that an electron level can never be occupied by electrons with the same spin. By means of the gate electrodes, a static potential well is generated on the one hand and, on the other hand, a movable potential well. A quantum dot is introduced into the static potential well, the quantum mechanical state of which is known at one level, which in the case of an electron is the spin. A further quantum dot of the same level is introduced into the static potential well at by means of the movable potential well. If the quantum mechanical states are different, then the level is filled. In this case, the sensor element detects a charge change in this level. If the quantum mechanical states of the quantum dots are the same, then the level cannot accept another quantum dot. The quantum mechanical state therefore does not change in this level. As a result, it is possible to determine the quantum mechanical state of the quantum dot introduced.

In order to guide the quantum dot with the movable potential well to the static potential well, the quantum dot must be transported through the substrate over a longer distance without changing the quantum mechanical state. For this purpose, the quantum dot is confined in the potential well, which is generated in a suitable manner by the gate electrode assembly. The potential well then moves continuously and in a directed manner through the substrate and carries the quantum dot with its quantum mechanical state over the distance. To enable continuous movement of the potential well, the electrode fingers of the gate electrodes are connected accordingly.

In an advantageous embodiment of the electronic component, a magnetic field generator is provided for generating a gradient magnetic field in order to initialize the quantum mechanical state of the quantum dot of the static potential well. A gradient magnetic field or an oscillating magnetic field can be generated with a micro-magnet, for example. These magnetic fields place the quantum dot in a desired quantum mechanical state. The electronic component can thus be initialized so that it is then able to interact with the quantum dot introduced into the same level.

In a preferred embodiment of the electronic component, a second gate electrode assembly comprises two gate electrodes, which together form a static double potential well, wherein each of the static potential wells has a quantum dot with different quantum mechanical states. In this case, each of the potential wells is occupied by known quantum mechanical states, which in the case of electrons are the spins. In this case, the charge carrier of one of the quantum dots, which are held in the double potential well, exchanges with the charge carrier of the moved quantum dot. As a result, the moved quantum dot always placed in a defined quantum mechanical state since the quantum mechanical states of the quantum dots in the double potential well are known. The sensor element can now check on the static double potential well if there is a change in charge. This makes it possible to determine the quantum mechanical state of the introduced quantum dot.

In a preferred embodiment of the electronic component, a gate electrode assembly comprises two parallel gate electrodes, which form a channel-like structure. This measure serves to ensure that the potential well can only move along a certain path in the substrate.

In an advantageous embodiment of such an electronic component, the substrate comprises gallium arsenide (GaAs) and/or silicon germanium (SiGe). These materials are able to form a two-dimensional electron gas in which quantum dots can be generated, held, and moved. In the case of gallium arsenide, the quantum dots are occupied by electrons. In the case of silicon germanium, the quantum dots are occupied by holes that are missing an electron.

In a further preferred embodiment of the electronic component, the respectively interconnected gate electrodes for the moved potential well are configured such that a periodic and/or phase-shifted voltage can be applied to them. This measure enables the potential well to be guided continuously through the substrate. A quantum dot located in the potential well can thus be transported through the substrate with the potential well while retaining its original quantum mechanical state.

In a preferred embodiment of the electronic component, at least every third electrode finger of a gate electrode for the movable potential well is connected together. This is to ensure that the potential well is always guaranteed over at least one period through which the potential well is moved. Only in this way is it possible to ensure continuous movement of the potential well with the quantum dot. In principle, other combinations are also possible when interconnecting gate electrodes, as long as the potential well can be moved together with the quantum dot. Correspondingly, an advantageous embodiment for the method for an electronic component is obtained in that at least every third gate electrode is connected together and a voltage is applied periodically to the interconnected gate electrodes.

In a further advantageous embodiment of the electronic component, means of connection are provided for connecting to a qubit of a quantum computer. Transporting the states of quantum dots over greater distances is particularly suitable for quantum computers. In quantum computers, it is necessary to connect qubits to one another. For this reason, the electronic component must provide contacts to connect at least two qubits to one another in order to transfer the quantum states of the quantum dots from one qubit to another qubit.

Further embodiments and advantages will become apparent from the subject matter of the subclaims and the drawings with the accompanying descriptions. Exemplary embodiments are explained in more detail below with reference to the accompanying drawings. The invention should not be limited solely to the exemplary embodiments listed. The present invention is intended to refer to all objects that a person skilled in the art would deem obvious now and in the future to realize the invention. The following detailed description refers to the best embodiments currently possible of the disclosure. They are only intended to illustrate the invention in more detail. The description is therefore not to be understood in a limiting sense, but is merely intended to illustrate the general principles of the invention since the scope of the invention is best defined by the appended claims. The prior art cited is considered part of the disclosure.

DETAILED DESCRIPTION

Figure 1:
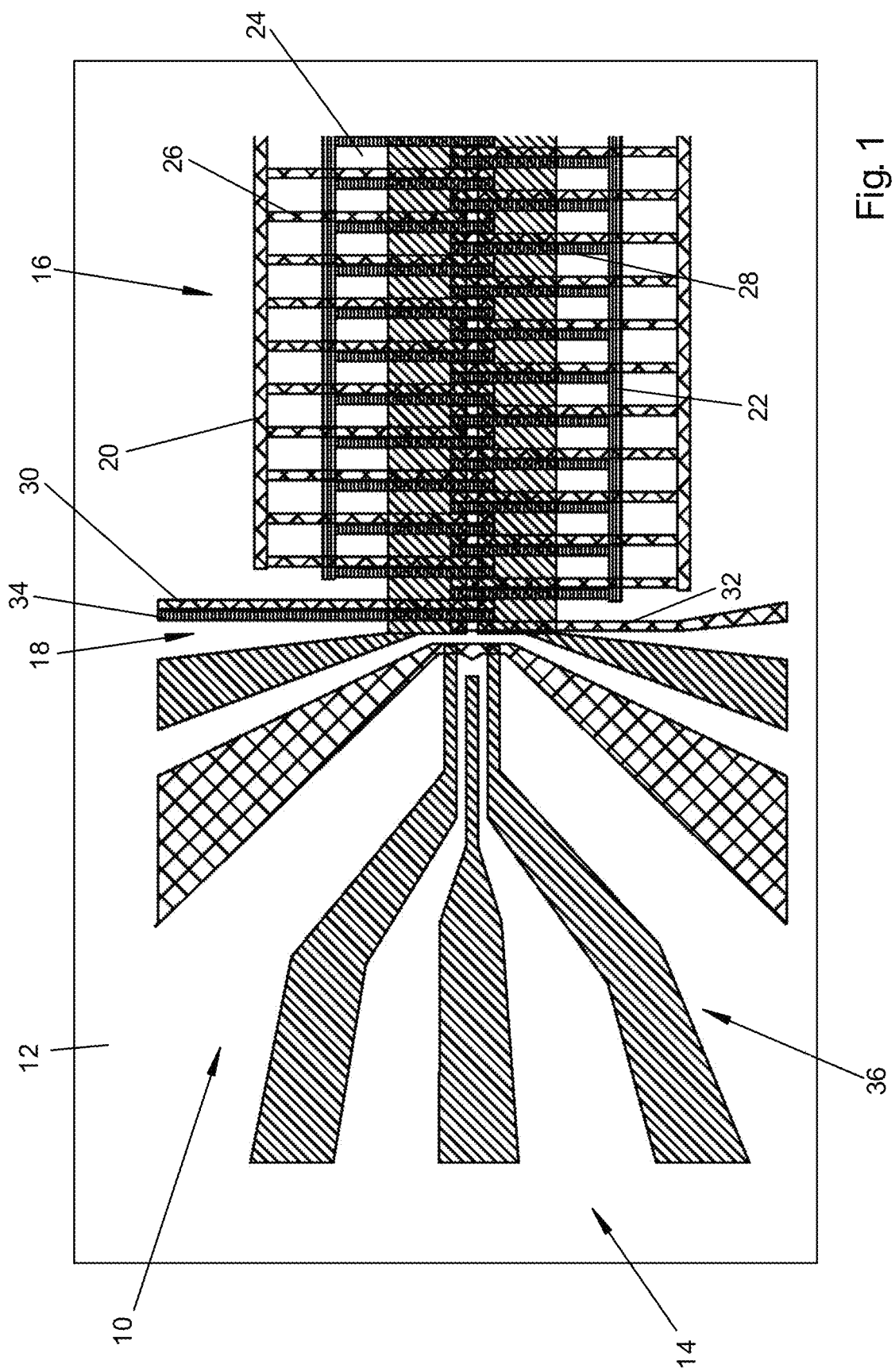
FIG. 1 shows a schematic top view of the electronic component for reading out the quantum state of a quantum dot with a static potential well.

FIG. 1 shows a first exemplary embodiment of an electronic component 10, which is formed from a semiconductor heterostructure. The structures of the component are preferably nanoscale structures. Undoped silicon germanium (SiGe) is used as the substrate 12 for the electronic component 10. The electronic component 10 is designed in such a manner that it comprises a two-dimensional electron gas (2DEG). Gate electrode assemblies 16, 18 are provided on a surface 14 of the substrate 12.

The gate electrode assembly 16 has two gate electrodes 20, 22. The individual gate electrodes 20, 22 are electrically isolated from one another in a suitable manner with insulating layers 24. The gate electrode assemblies 16, 18 are provided in layers, wherein the insulating layer 24 is provided between each gate electrode 20, 22. The gate electrodes 20, 22 further comprise electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a potential well is generated in the substrate 12. A quantum dot or charge carrier trapped in this potential well can thus be transported through the substrate in this manner. The potential well is transported longitudinally through the substrate through suitable control of the electrode fingers 26, 28 with sinusoidal voltages. The quantum dot or charge carrier confined in such a potential well can be transported with this potential well over a greater distance in the two-dimensional electron gas of the substrate 12 made of SiGe without experiencing a quantum mechanical change of state.

The gate electrode assembly 16 forms a region in which a quantum dot can be transported by means of a potential well. The gate electrode assembly 18, on the other hand, forms a static potential well. The gate electrode assembly 18 comprises for this purpose barrier gate electrodes 30, 32 and a pump gate electrode 34, which can set a quantum dot or a charge carrier in motion or in oscillation. The pump gate electrode 34 is arranged between the barrier gate electrodes 30, 32. The gate electrodes 30, 32, and 34 are also separated from one another by an insulating layer 24.

The barrier gate electrode assembly includes a sensor element 36 for detecting changes in charge. The sensor element 36 detects the charge present in the static potential well. The potential well is generated by the gate electrode assembly 18.

Figure 2:
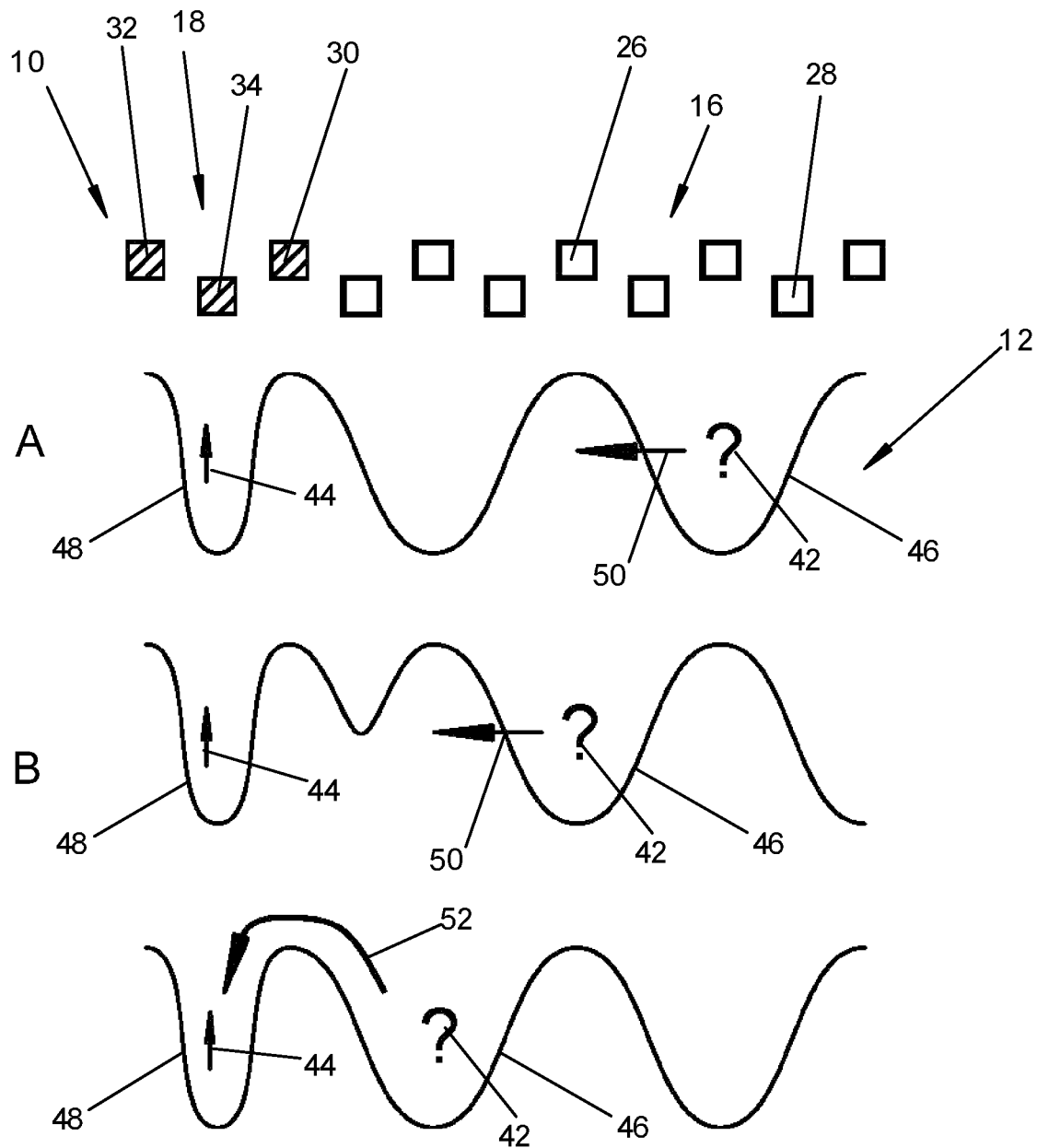
FIG. 2 shows a schematic diagram of the sequence of an electronic component for reading out the quantum state of a quantum dot with a static potential well.

FIG. 2 shows a schematic diagram of the sequence for reading out a quantum state of a qubit in a quantum dot 42. The diagram shows a section of the electronic component 10 so that only the electrode fingers 26, 28; the barrier gate electrodes 30, 32; and the pump gate electrodes 34 are visible in the section. Sequences from A to C of the positions of the potential wells 46, 48 in the substrate 12 are shown below this to explain the function. The electrode fingers 26, 28 of the gate electrode assembly 16 form the movable potential well 46 through the substrate 12. The movement of the quantum dot 42 in the potential well 46 is effected by appropriately interconnecting the electrode fingers 26, 28. The electrode fingers 26, 28 of the gate electrode assembly 16 provided for this purpose are periodically and alternately interconnected, which effects an almost continuous movement of the quantum dot 42 in the potential well 46 through the substrate 12.

The electronic component 10 is based on the physical Pauli Exclusion Principle, which states that an electron level can never be occupied by electrons with the same spin. By means of the gate electrodes 30, 32, a static potential well 48 is generated on the one hand and, on the other hand, a movable potential well 46 is generated by means of the gate electrodes 26, 28. A quantum dot 42 is introduced into the static potential well 48, the quantum mechanical state of which is known in one level, which in the case of an electron is the spin. The quantum dot is oriented with the pump gate electrode 40, for example with spin up, as illustrated here. A further quantum dot 44 of the same level is introduced into the static potential well 48 by means of the movable potential well 46. Arrow 50 indicates the direction of transport of the quantum dot 44 with movable potential well 46. If the quantum mechanical states are different, then the level is filled. The level can be filled by tunneling, which is symbolized by arrow 52.

In the event that a quantum dot has been added, the sensor element 36 detects a change in charge in this level. If the quantum mechanical states of the quantum dots 42, 44 are the same, then the level cannot accept another charge carrier 58. The quantum mechanical state therefore does not change in this level. As a result, it is possible to determine the quantum mechanical state of the quantum dot 42 introduced.

Figure 3:
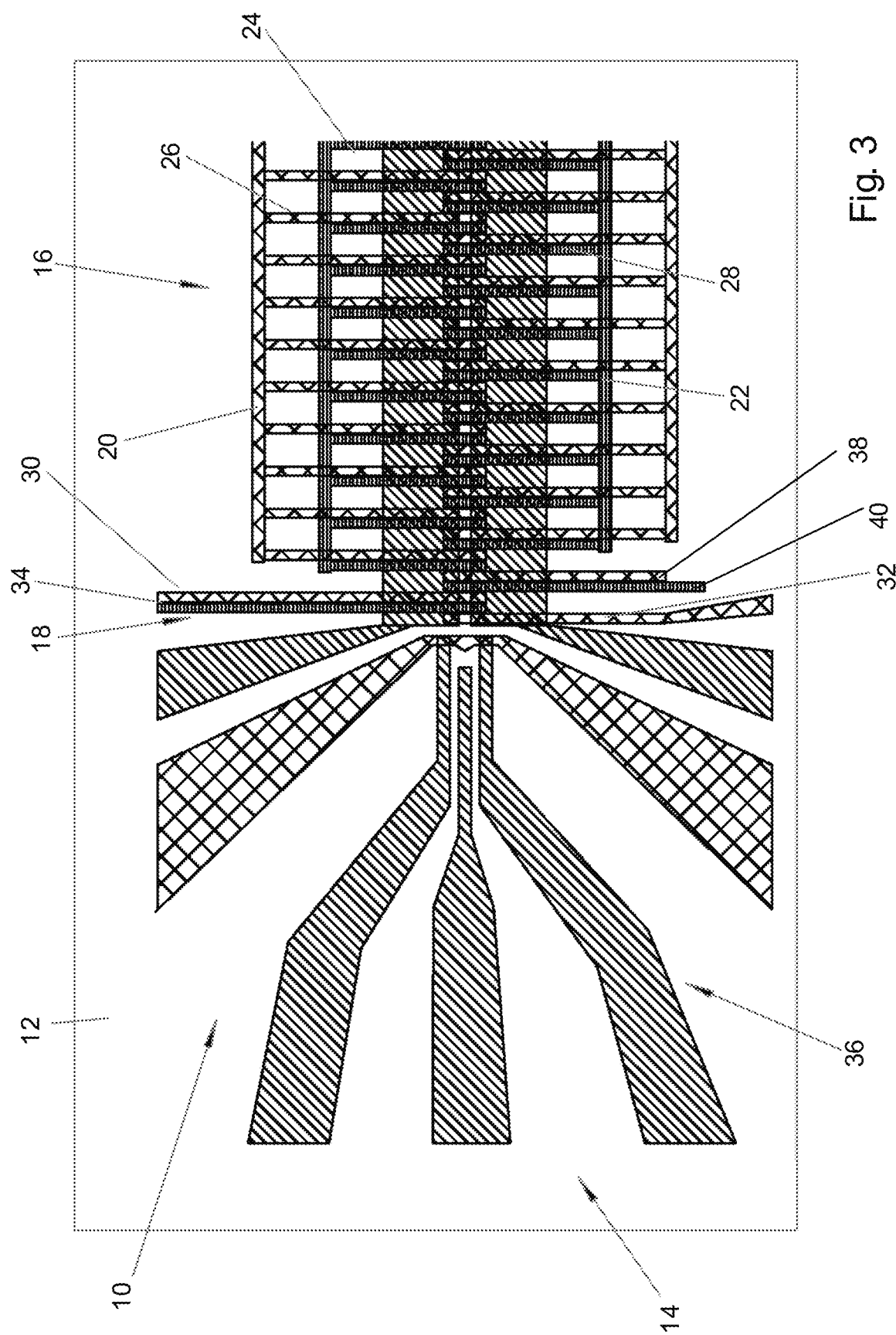
FIG. 3 shows a schematic top view of the electronic component for reading out the quantum state of a quantum dot with a static double potential well.

FIG. 3 shows a further exemplary embodiment of an electronic component 10, which is again formed from a semiconductor heterostructure. The structures of the component are preferably nanoscale structures. Undoped silicon germanium (SiGe) is used as the substrate 12 for the electronic component 10. The electronic component 10 is designed in such a manner that it comprises a two-dimensional electron gas (2DEG). The gate electrode assemblies 16, 18 are provided on the surface 14 of the substrate 12.

The gate electrode assembly 16 has two gate electrodes 20, 22. The individual gate electrodes 20, 22 are electrically isolated from one another in a suitable manner with insulating layers 24. The gate electrodes 20, 22 of the gate electrode assembly 16 are provided for this purpose in layers, wherein the insulating layer 24 is provided between each gate electrode 20, 22 of the gate electrode assembly 16. The gate electrodes 20, 22 further comprise the electrode fingers 26, 28, which are arranged parallel to another on the surface 14 of the substrate 12.

The gate electrode assemblies 16, 18 are supplied with a suitable voltage via electrical connections. By suitably applying sinusoidal voltages to the gate electrodes 20, 22 of the gate electrode assembly 16, a movable potential well is generated in the substrate 12. A quantum dot 42 or charge carrier trapped in this potential well can thus be transported through the substrate in this manner. The potential well is transported longitudinally through the substrate through suitable control of the electrode fingers 26, 28 with sinusoidal voltages. The quantum dot 42 confined in such a potential well can be transported with this potential well over a greater distance in the two-dimensional electron gas of the substrate 12 made of SiGe without experiencing a quantum mechanical change of state.

The gate electrode assembly 18 forms a static double potential well. The gate electrode assembly 18 comprises for this purpose barrier gate electrodes 30, 32, 38 and, in addition to the pump gate electrode 34, another pump gate electrode 40, which can set a quantum dot or a charge carrier in motion or in oscillation. The pump gate electrodes 34, 40 are alternately arranged between the barrier gate electrodes 30, 32, and 38.

The sensor element 36 for detecting changes in charge is adjacent to the barrier gate electrode assembly 18. The sensor element 36 detects the charge present in the static double potential well. The double potential well is generated by the gate electrode assembly 18.

Figure 4:
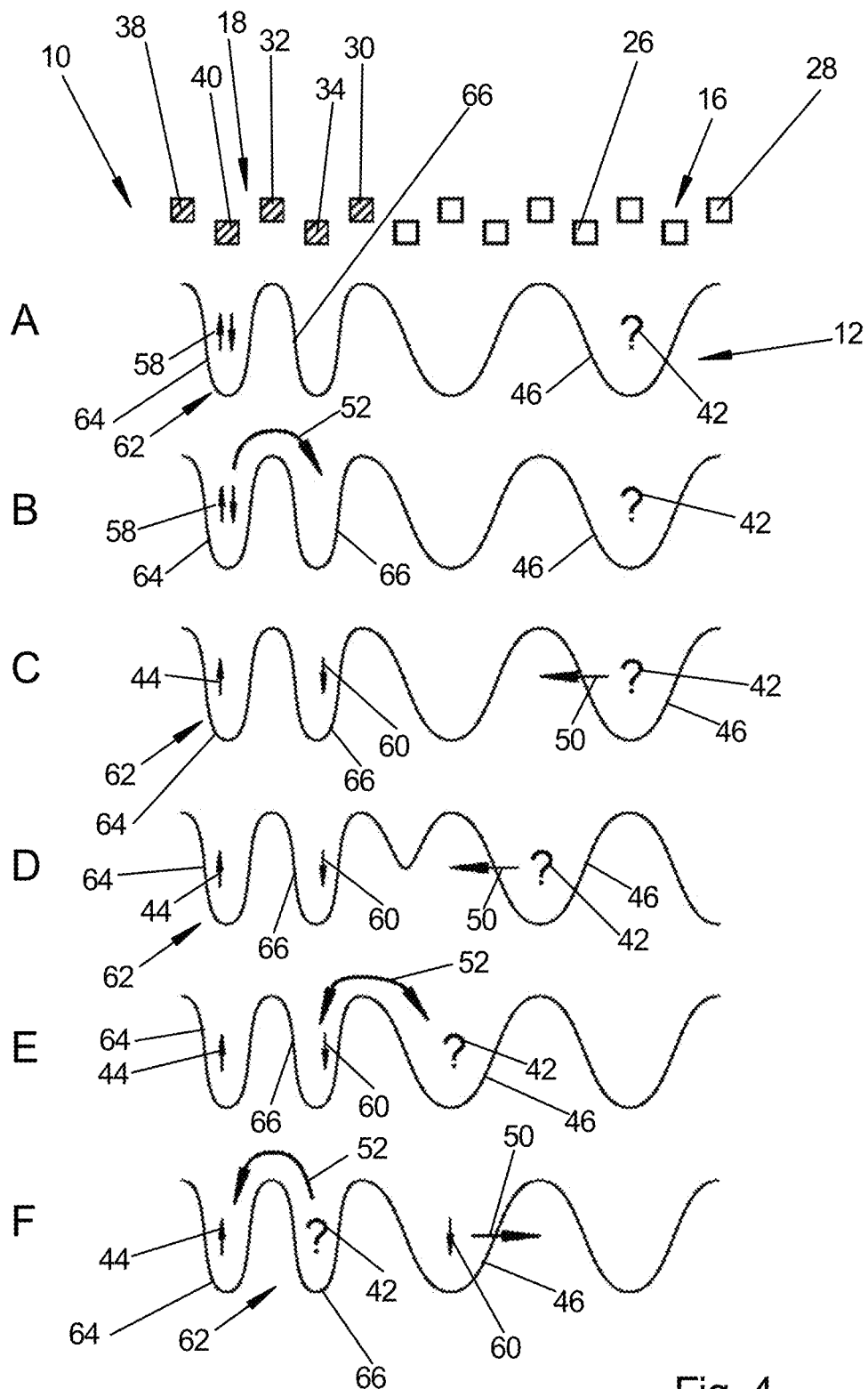
FIG. 4 shows a schematic diagram of the sequence of an electronic component for reading out the quantum state of a quantum dot with a static double potential well.

FIG. 4 shows a schematic diagram of the sequence for reading out a quantum state of a qubit in the quantum dot 42. The diagram shows a section of the electronic component 10 so that only the electrode fingers 26, 28; the barrier gate electrodes 30, 32, 38; and the pump gate electrodes 34, 40 are visible in the section. Sequences from A to F of the positions of the potential wells 46, 64, 66 in the substrate 12 are shown below this to explain the function. The electrode fingers 26, 28 of the gate electrode assembly 16 form the movable potential well 46 through the substrate 12. The movement of the potential well 46 is effected by appropriately interconnecting the electrode fingers 26, 28. The electrode fingers 26, 28 of the gate electrode assembly 16 provided for this purpose are periodically and alternately interconnected, which effects an almost continuous movement of the potential well 46 through the substrate 12.

The electronic component 10 is based on the physical Pauli Exclusion Principle, which states that an electron level can never be occupied by electrons with the same spin. By means of the gate electrodes 30, 32, and 38, a static double potential well 62 is generated on the one hand and, on the other hand, the movable potential well 46. A charge carrier 58 is introduced into a first potential well 64 of the static double potential well 62. Two charge carriers 58 are split with the pump gate electrodes 34, 40, for example with the aid of a gradient magnetic field. A split charge carrier 60 tunnels into a second static potential well 66. A further quantum dot 42 is introduced into the second static potential well 66 of the double potential well 62 of the same level by means of the movable potential well 46. The arrow 50 indicates the direction of transport of the quantum dot 42 with the movable potential well 46. The quantum dot 60 of the second static potential well 66 exchanges with the quantum dot 42 of the movable potential well 46. The quantum mechanical state with the movable potential well 46 is known. The quantum dot 42, provided it has the same spin as the quantum dot 60, tunnels into the first static potential well of the double potential well 62. The sensor element 36 does not detect any change in charge. If the quantum mechanical states of the quantum dots 60 and 42 differ, then a change in charge is detected. The level can be filled by tunneling, which is symbolized by arrow 52.

LIST OF REFERENCE SIGNS

10 Electronic component
12 Substrate
14 Surface
16 Gate electrode assembly
18 Gate electrode assembly
20 Gate electrodes
22 Gate electrodes
24 Insulating layer
26 Electrode fingers
28 Electrode fingers
30 Barrier gate electrode
32 Barrier gate electrode
34 Pump gate electrode
36 Sensor element
38 Barrier gate electrodes
40 Pump gate electrode
42 Quantum dot
44 Quantum dot
46 Moved potential well
48 Static potential well
50 Arrow (transportation)
52 Arrow (tunneling)
58 Charge carrier
60 Split quantum dot
62 Double potential well
64 First static potential well
66 Second static potential well

The invention claimed is:

1. An electronic component, which is formed by a semiconductor component having gate electrode assemblies, for reading out a quantum state of a qubit in a quantum dot, comprising:
    a substrate with a two-dimensional electron gas or electron hole gas;
    electrical contacts for connecting the gate electrode assemblies to voltage sources;
    gate electrode assemblies having gate electrodes, which are arranged on a surface of the electronic component, for producing potential wells in the substrate;
    parallel electrode fingers being part of the gate electrodes of the gate electrode assemblies,
        wherein in a first gate electrode assembly, the electrode fingers are interconnected in a periodically alternating manner, which causes an almost continuous movement of the potential well through the substrate, whereby a first quantum dot is transported together with this potential well, and
        wherein the electrode fingers of a second gate electrode assembly form a static potential well in which a second charge carrier with a known quantum mechanical state is provided; and
    a sensor element for detecting changes in the charge, which detects the charge in the static potential well, wherein the first quantum dot is transported to a second quantum dot.

2. The electronic component according to claim 1, further comprising a magnetic field generator for generating a gradient magnetic field in order to initialize the quantum mechanical state of the quantum dot of the static potential well.

3. The electronic component according to claim 1, wherein the second gate electrode assembly comprises two further gate electrodes, which together form a static double potential well,
    wherein each of the static potential wells has a quantum dot with different quantum mechanical states.

4. The electronic component according to claim 1, wherein a gate electrode assembly for the moved potential well comprises two parallel gate electrodes, which form a channel-like structure.

5. The electronic component according to claim 1, wherein the substrate of the electronic component comprises gallium arsenide (GaAs) and/or silicon germanium (SiGe).

6. The electronic component according to claim 1, wherein the respectively interconnected gate electrodes for the moved potential well are configured such that a periodic and/or phase-shifted voltage can be applied to them.

7. The electronic component according to claim 1, wherein every third electrode finger is connected to a gate electrode for the movable potential well.

8. The electronic component according to claim 1, further comprising means of connection for connecting to a qubit of a quantum computer.

9. The electronic component according to claim 1, further comprising a magnetic field generator for a switchable magnetic field.

10. A method for the electronic component according to claim 1, comprising the following method steps:
    introducing a first charge carrier into the quantum dot of the static potential well;
    initializing the quantum mechanical state of the charge carrier of the first quantum dot;
    detecting the charge of the first quantum dot by the sensor element;
    introducing a qubit of the second quantum dot into the movable potential well;
    bringing the movable potential well towards the static potential well;
    transferring the charge from quantum dot into quantum dot;
    detecting the charge by the sensor element in the static potential well; and
    checking the change in charge in the static potential well.

11. The method according to claim 10, wherein the static potential well is formed as a double potential well, each of which is occupied by charge carriers with different quantum mechanical states.

12. The method according to claim 10, further comprising:
    applying a phase-shifted voltage to the interconnected gate electrodes for the movable potential well, which causes an almost continuous movement of the potential well through the substrate, and thereby transporting a quantum dot with this potential well.

13. The method according to claim 10, further comprising connecting every fourth gate electrode for the movable potential well to one other, and
    applying a periodic voltage to the every fourth gate electrodes.

* * * * *